United States Patent
Nakahara et al.

(10) Patent No.: US 7,264,677 B2
(45) Date of Patent: *Sep. 4, 2007

(54) PROCESS FOR TREATING SOLID SURFACE AND SUBSTRATE SURFACE

(75) Inventors: Miwako Nakahara, Yokohama (JP); Toshiyuki Arai, Machida (JP); Shigeru Ohno, Yokohama (JP); Takashi Yunogami, Niiza (JP); Sukeyoshi Tsunekawa, Iruma (JP); Kazuto Watanabe, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/252,786

(22) Filed: Oct. 19, 2005

(65) Prior Publication Data

US 2006/0037627 A1 Feb. 23, 2006

Related U.S. Application Data

(60) Division of application No. 10/460,260, filed on Jun. 13, 2003, now Pat. No. 7,025,896, which is a continuation of application No. 09/983,209, filed on Oct. 23, 2001, now Pat. No. 6,613,242, which is a continuation of application No. 09/556,319, filed on Apr. 24, 2000, now Pat. No. 6,537,461.

(51) Int. Cl.
   *C23G 1/00* (2006.01)
(52) U.S. Cl. ............... 134/2; 134/21; 134/22.1; 216/37; 216/76; 216/77
(58) Field of Classification Search ............ None
   See application file for complete search history.

(56) References Cited

U.S. PATENT DOCUMENTS

| 4,747,907 A | * | 5/1988 | Acocella et al. ............ 216/93 |
| 5,236,550 A | * | 8/1993 | Abt et al. ................. 216/67 |
| 5,254,217 A |   | 10/1993 | Maniar et al. |
| 5,382,320 A | * | 1/1995 | Desu et al. ............... 438/712 |
| 5,407,855 A | * | 4/1995 | Maniar et al. ............ 438/3 |

(Continued)

FOREIGN PATENT DOCUMENTS

JP   6-283438   10/1994

(Continued)

OTHER PUBLICATIONS

R. Loessberg, et al., "Eine Methode zur Synthese von wasserfreiem Ruthenium (VIII)-oxid", in Zeitschrift Fuer Naturforschung, Section B, Chemical Sciences, vol. 16B, No. 3, 1981, p. 395.

(Continued)

*Primary Examiner*—Allan Olsen
(74) *Attorney, Agent, or Firm*—Antonelli, Terry, Stout & Kraus, LLP.

(57) ABSTRACT

Ruthenium, osmium and their oxides can be etched simply and rapidly by supplying an atomic oxygen-donating gas, typically ozone, to the aforementioned metals and their oxides through catalysis between the metals and their oxides, and the ozone without any damages to wafers and reactors and application of the catalysis not only to the etching but also to chamber cleaning ensures stable operation of reactors and production of high quality devices.

11 Claims, 11 Drawing Sheets

U.S. PATENT DOCUMENTS

| | | |
|---|---|---|
| 5,624,583 A | 4/1997 | Tokashiki et al. |
| 5,883,781 A * | 3/1999 | Yamamichi et al. ..... 361/321.4 |
| 5,888,857 A | 3/1999 | Zhang et al. |
| 5,972,722 A | 10/1999 | Visokay et al. |
| 6,008,135 A * | 12/1999 | Oh et al. .................... 438/720 |
| 6,136,767 A | 10/2000 | Hineman et al. |
| 6,432,835 B1 * | 8/2002 | Yunogami et al. .......... 438/720 |
| 6,436,723 B1 * | 8/2002 | Tomita et al. ................. 438/3 |
| 6,495,054 B1 * | 12/2002 | Eguchi et al. ................. 216/58 |
| 6,537,461 B1 | 3/2003 | Nakahara et al. |
| 6,592,771 B1 * | 7/2003 | Yamanaka et al. ............ 216/63 |
| 6,613,242 B2 | 9/2003 | Nakahara et al. |
| 6,659,111 B1 | 12/2003 | Mouri et al. |
| 6,673,262 B1 | 1/2004 | Mori et al. |
| 2001/0006245 A1 | 7/2001 | Yunogami et al. |
| 2001/0023701 A1 | 9/2001 | Aoki et al. |

FOREIGN PATENT DOCUMENTS

| | | |
|---|---|---|
| JP | 7-157832 | 6/1995 |
| JP | 8-78396 | 3/1996 |
| JP | 9-246214 | 9/1997 |
| JP | 2001/068463 A | 3/2001 |

OTHER PUBLICATIONS

Patent Abstracts of Japan, Pub. No. 08-153707 (Jun. 11, 1996).

* cited by examiner

MASS SPECTRUM OF ETCHING OF Ru FILM USING $O_3$

QMS ANALYSIS OF CLEANING REACTION

WAFER UPSIDE

WAFER BACKSIDE

■ CONTAMINATED AREA WITH Ru ≥ $10^{13}$ ATOMS/cm²

⬇ AFTER WAFER DRY CLEANING

WAFER UPSIDE

WAFER BACKSIDE

US 7,264,677 B2

PROCESS FOR TREATING SOLID SURFACE AND SUBSTRATE SURFACE

This application is a Divisional application of application Ser. No. 10/460,260, filed Jun. 13, 2003 now U.S. Pat. No. 7,025,896, issued Apr. 11, 2006, which is a Continuation application of application Ser. No. 09/983,209, filed Oct. 23, 2001, now U.S. Pat. No. 6,613,242, issued Sep. 2, 2003, which is a Continuation application of application Ser. No. 09/556,319, filed Apr. 24, 2000, now U.S. Pat. No. 6,537,461, issued Mar. 25, 2003. The contents of Ser. No. 09/556,319 are incorporated herein by reference in their entirety.

BACKGROUND OF THE INVENTION

The present invention relates to a process for treating the surface of a solid containing ruthenium, osmium or their oxide by etching. Furthermore, the present invention relates to a process for producing a semiconductor device, particularly to a process for etching treatment and cleaning treatment of said metal or its oxide formed above a substrate and also relates to a process for cleaning a CVD reactor or an etching reactor used in the foregoing processes.

With recent higher integration of semiconductor devices, devices with memory cells such as DRAM, etc. will have more and more complicated spatial structures to ensure a condenser capacitance. Consequently, number of steps for device production is increased and a margin for thin film formation and processing is narrowed, thereby increasing the production cost and lowering the yield. Thus, it is essential for an increase in the condenser capacitance to use novel high-dielectric materials to simplify the structure.

Double oxides such as $BaSrTiO_3$ are now under study as such high dielectric materials. It is necessary to conduct high temperature annealing in an oxygen atmosphere during the formation of these oxides. However, in case of using Si as a condenser lower electrode material, it is hard to suppress an increase in the resistance due to oxidation during the oxygen annealing, and thus it is necessary to use scarcely oxidizable novel materials or materials which have a good electroconductivity even if oxidized.

As electrode materials which can satisfy these conditions, for example, ruthenium and ruthenium oxide are now under study.

As a process suitable for forming these electrode materials, a CVD (chemical vapor deposition) process has been proposed, which can produce a thin film of high purity and distinguished crystallinity with a good thin film depositability onto a substrate relative to the physical vapor deposition.

Processes for forming a thin film of ruthenium or ruthenium oxide by MO-CVD using specific organic feed gases are disclosed, for example, in JP-A-6-283438 and JP-A-9-246214.

As to processes for forming a thin film of ruthenium or ruthenium oxide by etching, on the other hand, a process for producing a semiconductor device, which comprises a step of plasma etching using a gas mixture comprising at least one member selected from the group consisting of a halogen gas comprising at least one of fluorine gas, a chlorine gas and an iodine gas and hydrogen halides, and an oxygen gas or an ozone gas is disclosed, for example, in JP-A-8-78396.

Furthermore, a process for obtaining pure ruthenium tetraoxide by reaction of ruthenium with ozone at room temperature is disclosed by Rainer Loessberg and Wrich Mueller in Zeitschrift fuer Naturforschung, Section B, Chemical Sciences, vol. 16B, No. 3, 1981, pp 395.

Still furthermore, as to a technique of removing ruthenium residues, a wet cleaning process using a cleaning solution comprising periodic acid and nitric acid is disclosed in Japanese Patent Application No. 11-245143.

BRIEF SUMMARY OF THE INVENTION

An object of the present invention is to improve said prior art processes and provide a process for treating ruthenium, osmium or their oxides simply and rapidly by etching without any damages to wafers or devices.

The present invention provides a process for treating a solid surface, characterized by treating the surface of a solid comprising at least one member selected from the group consisting of ruthenium, ruthenium oxide, osmium and osmium oxide by etching by supplying a gas comprising an atomic oxygen-donating gas to the solid surface.

Furthermore, the present invention provides a process for treating a substrate surface, a process for cleaning a substrate, a process for cleaning a reactor for producing a semiconductor and a process for producing a semiconductor device, utilizing said process for treating the solid surface.

DETAILED DESCRIPTION OF THE INVENTION

The present invention will be described below in detail, where description will be made on the essential points of the present invention not disclosed in said prior art.

Processes for etching ruthenium or ruthenium oxide disclosed in said prior art are based on plasma etching reactions using ion-assist reactions, where use of a plasma makes it difficult to prevent an etching target from damaging and also increases a reactor cost. Thus, it has been keenly desired to provide a simple etching process without any damages to substrates.

Likewise in the conventional processes for removing ruthenium residues or contaminations, removal based on the plasma etching reactions gives damages to substrates and the wet cleaning process requires steps of rinsing and drying. Thus, it has been also desired to provide a simple process for cleaning ruthenium residues or contaminations without any damages to substrates.

In case of producing a semiconductor device such as DRAM, etc. using a CVD reactor for forming a thin film of ruthenium or ruthenium oxide as novel materials or using an etching reactor for forming a pattern by etching the thin film, on the other hand, it has been desired in the semiconductor industry to establish a process for removing reaction products including ruthenium as accumulated or deposited in the reactor chambers or pipes by cleaning to reduce dust emission from the reactors and produce semiconductor devices in good yield, thereby making ready for the next step.

Generally, in case of etching ruthenium or osmium, it is possible to remove said metal by converting it to a metal compound with a higher vapor pressure (e.g. ruthenium compound or osmium compound).

Figure 1:
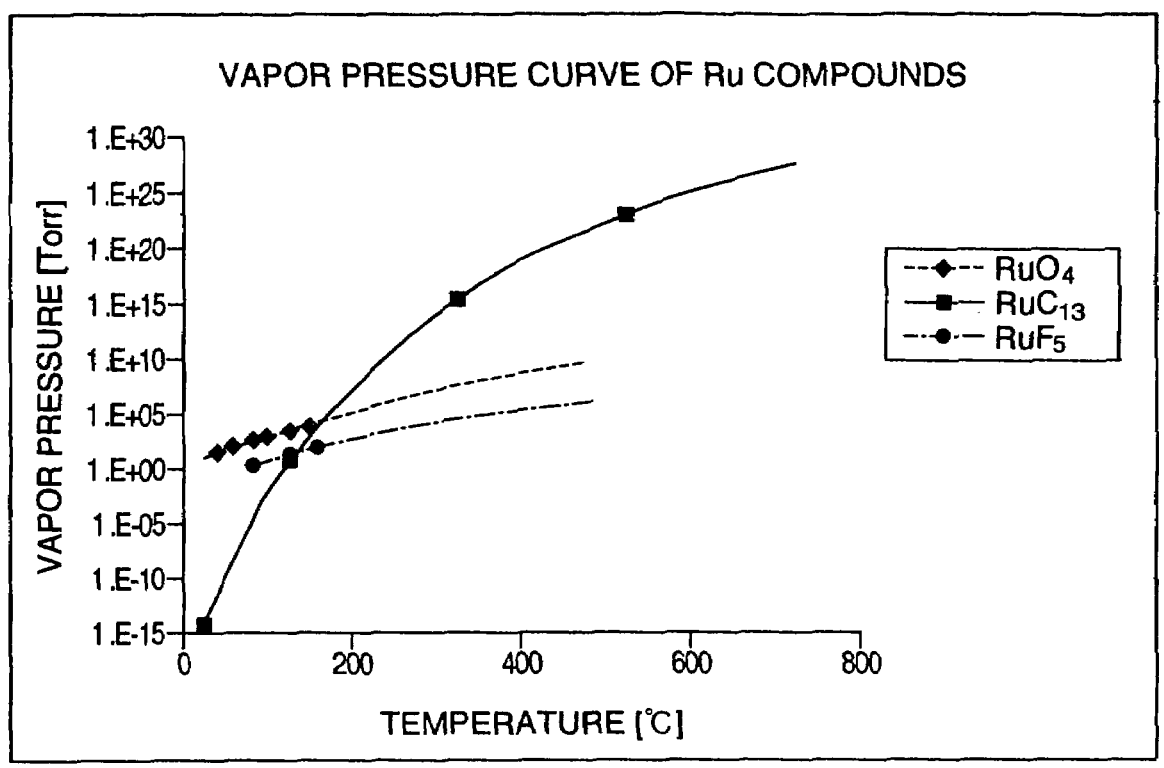
FIG. 1 is a graph showing vapor pressure curves of ruthenium compounds.

For example, temperature dependency of vapor pressures of typical ruthenium compounds is shown in FIG. 1. As is evident from FIG. 1, $RuO_4$ is an oxide having the highest vapor pressure at 200° C. or lower temperatures. It can be seen therefrom that in case of using ruthenium in a semiconductor device a relatively low etching temperature is desirable in the etching treatment step from the view-point of thermal budget and throughput, and it is actually preferable to form $RuO_4$ with a higher vapor pressure characteristic in a temperature range of not higher than 200° C.

Furthermore, formation of a metal oxide has a great merit as to the reactor structure and its maintenance. That is, in case of forming and utilizing a metal halide, a highly corrosive halogen-based gas is used and thus a complete safety means must be provided on the reactor, the treatment process, etc.

Reaction of forming $RuO_4$ from ruthenium will be described below:

Studies have been made from a thermodynamic viewpoint on a process for forming said oxide by non-plasma-based reaction without using high energy such as plasma, etc. to establish a simple etching process with less damages to an etching target.

Figure 2A:
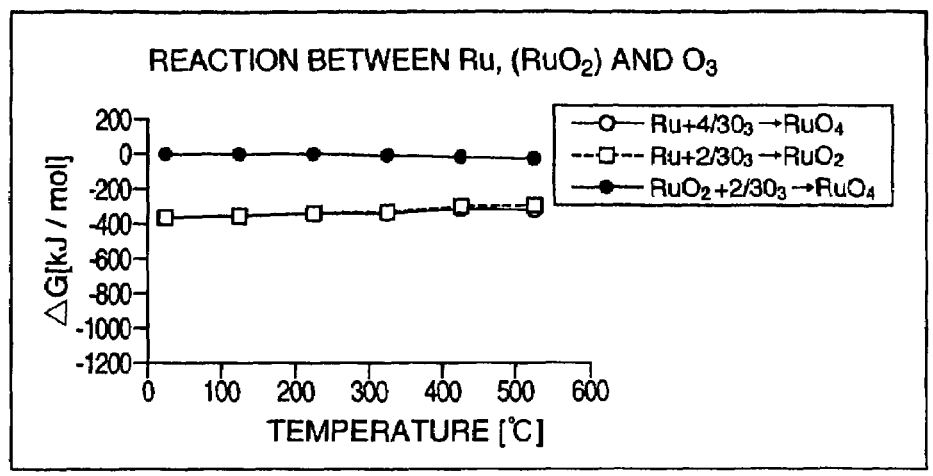
FIGS. 2A to 2C are graphs showing relationships between differences in Gibbs' free energy and reaction temperatures in ruthenium oxidation reactions.
Figure 2B:
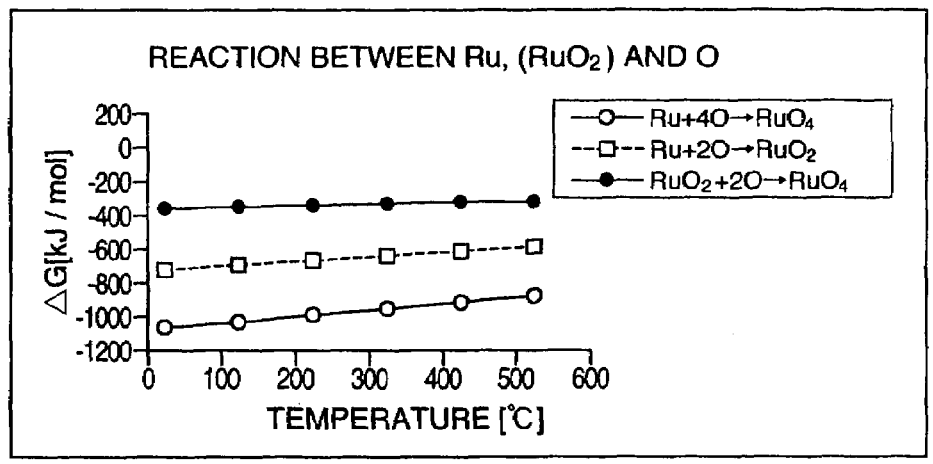
Figure 2C:
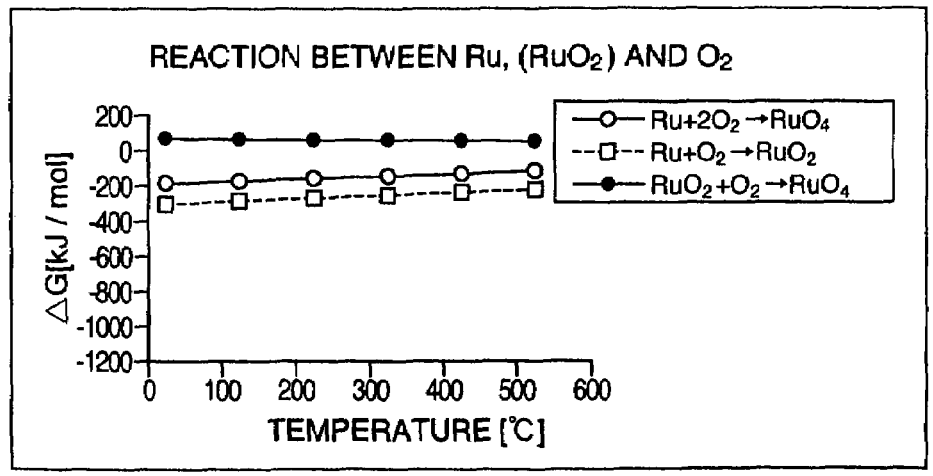

FIGS. 2A to 2C show relationships between differences in Gibbs' free energy ($\Delta G$) and reaction temperatures in the reaction of forming $RuO_4$ from Ru.

Relationships between $\Delta G$ and reaction equilibrium constant (K) can be given by the following equation:

$$K \propto \exp(-\Delta G/RT)$$

where R is a gas constant and T is an absolute temperature.

This equation means that with increasing difference in Gibbs' free energy ($\Delta G$) towards the plus side oxidation reaction of ruthenium less proceeds, whereas with increasing $\Delta G$ towards the minus side the oxidation reaction is promoted.

It is evident from the results of FIGS. 2A to 2C that in case of reaction of ruthenium by ozone or atomic oxygen the reaction proceeds more easily because the difference in Gibbs' free energy ($\Delta G$) to form $RuO_4$ is larger towards the minus side, and even if $RuO_2$ happens to form in the course of reaction. $RuO_2$ further reacts with ozone or atomic oxygen to form $RuO_4$.

As is obvious from FIG. 2C, even if the difference in Gibbs' free energy ($\Delta G$) to form $RuO_4$ is on the minus side in the reaction of Ru with $O_2$, on the other hand, its absolute value is far less than those in case of ozone or atomic oxygen, the reaction is hard to proceed. Once $RuO_2$ is formed in the reaction with $O_2$, conversion of $RuO_2$ to $RuO_4$ hardly proceeds.

It is obvious from these test results, ruthenium or ruthenium oxide must be made to react with ozone or atomic oxygen to form $RuO_4$ therefrom. The foregoing reaction mechanism is true not only of ruthenium but also of osmium.

When a very small amount of a halogen gas or a hydrogen halide gas is added to the ozone gas or atomic oxygen gas to cause halogenation reaction of ruthenium, formation of $RuO_2$, which is relatively stable and hard to undergo further reaction, can be suppressed. By adding a reductive gas thereto, the formed $RuO_2$ can be reduced to Ru.

Based on the foregoing reaction behavior of ruthenium, the present invention has been established to provide a process for treating the surface of a solid comprising at least one member selected from the group consisting of ruthenium, ruthenium oxide, osmium and osmium oxide by etching, where the etching treatment of the solid surface can be attained by supplying an atomic oxygen-donating gas to the solid surface.

Furthermore, by conducting the same treatment as described above to a substrate surface with a film of said metal or metal oxide as formed thereon, etching treatment of the substrate surface can be attained.

Still furthermore, by treating a substrate with a film or particles comprising at least one member selected from the group consisting of ruthenium, ruthenium oxide, osmium and osmium oxide, as deposited thereon, according to the same process as described above, cleaning treatment of the substrate can be attained.

Still furthermore, in cleaning treatment of a CVD reactor for forming a film comprising at least one of said members on a substrate or in cleaning treatment of an etching reactor for forming a pattern by etching said film, reaction products including ruthenium or osmium as accumulated or deposited at least in the chambers of these reactors or on the surfaces of pipings can be likewise removed.

In the present invention, the atomic oxygen-donating gas includes, for example, at least a gas selected from the group consisting of ozone, oxygen halide, nitrogen oxide and atomic oxygen and can be used in the etching treatment upon admixing the gas with a halogen gas, a hydrogen halide gas or a reductive gas or further with at least a gas selected from the group consisting of fluorine, chlorine, bromine, chlorine fluoride, hydrogen fluoride, hydrogen chloride, hydrogen bromide, hydrogen, carbon monoxide, ammonia and phosphorus hydride.

These treatment reactions are non-plasma etching treatments and are carried out so as not to form an ion sheath on or above the surface of a solid or substrate.

The foregoing reactions of the present invention can be attained at a solid or substrate surface temperature of 20° to 350° C., preferably 40° to 200° C., more preferably 40° to 180° C.

The present invention will be described more in detail below, referring to varieties of processes as envisaged according to the present invention, to each of which the aforementioned treatment conditions can be applied.

[A] A process for treating a substrate surface, which comprises (1) a step of transferring a substrate to a treatment chamber from a transfer chamber, (2) a step of adjusting the temperature of the substrate, (3) a step of supplying a gas comprising an atomic oxygen-donating gas into the treatment chamber, (4) a step of treating the substrate surface in the treatment chamber by etching, and (5) a step of transferring the treated substrate to the transfer chamber from the treatment chamber, where a film comprising at least one member selected from the group consisting of ruthenium, ruthenium oxide, osmium and osmium oxide, formed above the substrate in the step (3), is etched in the step (4).

[B] A process for cleaning a substrate, which comprises (1) a step of transferring a substrate to a treatment chamber from a transfer chamber, (2) a step of adjusting the temperature of the substrate, (3) a step of supplying a gas comprising an atomic oxygen-donating gas into the treatment chamber, (4) a step of cleaning the substrate in the treatment chamber, and (5) a step of transferring the cleaned substrate to the treatment chamber to the transfer chamber, where a film or particles comprising at least one member selected from the group consisting of ruthenium, ruthenium oxide, osmium and osmium oxide, deposited above the substrate in the step (3) is removed in the step (4).

[C] A process for cleaning a substrate, which comprises (1) a step of transferring a substrate to a treatment chamber from a transfer chamber, (2) a step of adjusting the temperature of the substrate, (3) a step of supplying a gas comprising an atomic oxygen-donating gas into the treatment chamber, (4) a step of cleaning the substrate in the treatment chamber, and (5) a step of transferring the cleaned substrate to the transfer chamber from the treatment chamber, where a film or particles comprising at least one member selected from the group consisting of ruthenium, ruthenium oxide, osmium and osmium oxide, deposited at least at edges or on the backside of the substrate in the step (3) is removed in the step (4).

[D] A process for cleaning a reactor for producing a semiconductor device, the reactor comprising a treatment chamber for treating a substrate, which comprises removing at least one of ruthenium, osmium and a reaction product comprising at least one of ruthenium and osmium accumulated or deposited on the surfaces of members in the treatment chamber by a gas comprising an atomic oxygen-donating gas.

[E] A process for cleaning a reactor for producing a semiconductor device, the reactor comprising a treatment chamber for treating a substrate, which comprises (1) a step of transferring a substrate into the treatment chamber, (2) a step of treating the substrate, (3) a step of transferring the treated substrate from the treatment chamber, and (4) a step of cleaning to remove products accumulated or deposited on the surfaces of members in the treatment chamber after the transfer of the substrate, where the product is at least one of ruthenium, osmium and a reaction product comprising at least one of ruthenium and osmium, the product is removed by a gas comprising an atomic oxygen-donating gas, and the step (4) is carried out after desired repetitions of the step (2).

[F] A process for producing a semiconductor device, which comprises (1) a step of forming a film comprising at least one member selected from the group consisting of ruthenium, ruthenium oxide, osmium and osmium oxide above a substrate placed in a first treatment chamber, (2) a step of forming a circuit pattern on the film above the substrate placed in a second treatment chamber, and (3) a step of cleaning to remove a reaction product including the film, accumulated or deposited on the surfaces of members in at least one of the first treatment chamber and the second treatment chamber, where step (3) of cleaning is carried out by a gas comprising an atomic oxygen-donating gas.

The present invention will be described in detail below, referring to drawings.

"Semiconductor device" herein referred to means semiconductor devices such as memory elements, etc. formed on a silicon substrate, TFT element for liquid crystal display formed on a quartz or glass substrate, and other devices in general, form on substrates. "Substrate" herein referred to means semiconductor substrates of silicon, etc. for forming a semiconductor device on their surfaces, insulating substrates and their composite substrates, but is not limited thereto.

"Non-plasma etching treatment" herein referred to does not mean an etching treatment using an ion sputtering action or an etching treatment using an ion-assist reaction such as reactive ion etching, where reaction by ions acceleratedly injected onto a target surface is dominant, but means an etching treatment using chemical reactions between constituent molecules themselves of an etching gas and a target surface, which take place in a high level energy state brought about mainly due to the external heat.

Thus, it is so characteristic of the present invention that no ion sheath is formed on or above the surface of a solid, a substrate or in the reactor in contrast to its formation so often observable in case of the plasma etching.

Detailed description will be made below as to "ion sheath". "Ion sheath" means a space charge layer, which is formed by contact of plasma with a solid. As the plasma electron temperature is generally higher than the ion temperature, light electrons are injected into the solid surface at a high speed, so that the solid will have a negative potential relative to the plasma. Thus, the injected electrons are moderated or reflected in positions near the solid surface to form an ion-excess space charge layer, i.e. ion sheath. When chemical reactions take place in a thermal atmosphere, as will be hereinafter described, on the other hand, there will be no plasma near the solid surface and thus no ion sheath will be formed.

However, a remote plasma treatment, which comprises transporting to a target solid surface a plasma gas existing in a space isolated from the target solid through a pipe, forms no ion sheath near the target solid surface and thus is included in the non-plasma treatment.

"Ruthenium oxide" means any one of $RuO$, $RuO_2$, $RuO_3$ and $RuO_4$, and "osmium oxide" means any one of $OsO$, $Os_2O_3$, $OSO_2$, $OSO_3$ and $OsO_4$.

EXAMPLE 1

Figure 3A:
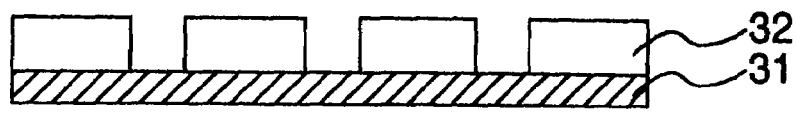
FIGS. 3A to 3C are cross-sectional views showing steps of producing a semiconductor device according to Example 1.
Figure 3B:
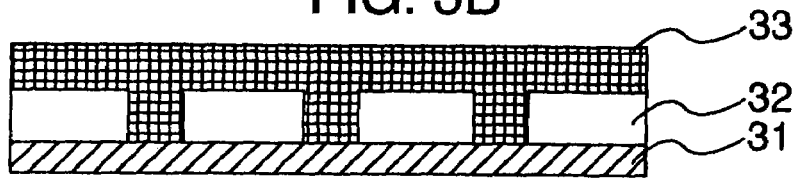
Figure 3C:
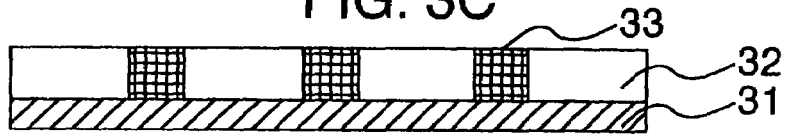

An embodiment of etching a ruthenium film formed above a substrate, in case of a semiconductor device is given below, and a sequence of etching steps is shown in FIGS. 3A to 3C.

FIG. 3A is a cross-sectional view of a semiconductor device, where a silicon oxide film 32 is formed on a silicon wafer (silicon substrate) 31 by well known thermal oxide film formation and then a pattern is formed on the silicon oxide film 32 by anisotropic dry etching.

Then, as shown in FIG. 3B, a ruthenium film 33 is formed on the silicon oxide film 32 by ordinary CVD and then a portion of the ruthenium film 33 is removed by ordinary dry etching, as shown in FIG. 3C, so as to bring the silicon dioxide film 32 and the ruthenium film to an equal surface level.

In this manner, the ruthenium film 33 is filled in the holes formed by the anisotropic dry etching to complete plugs 33 consisting of ruthenium.

Figure 4:
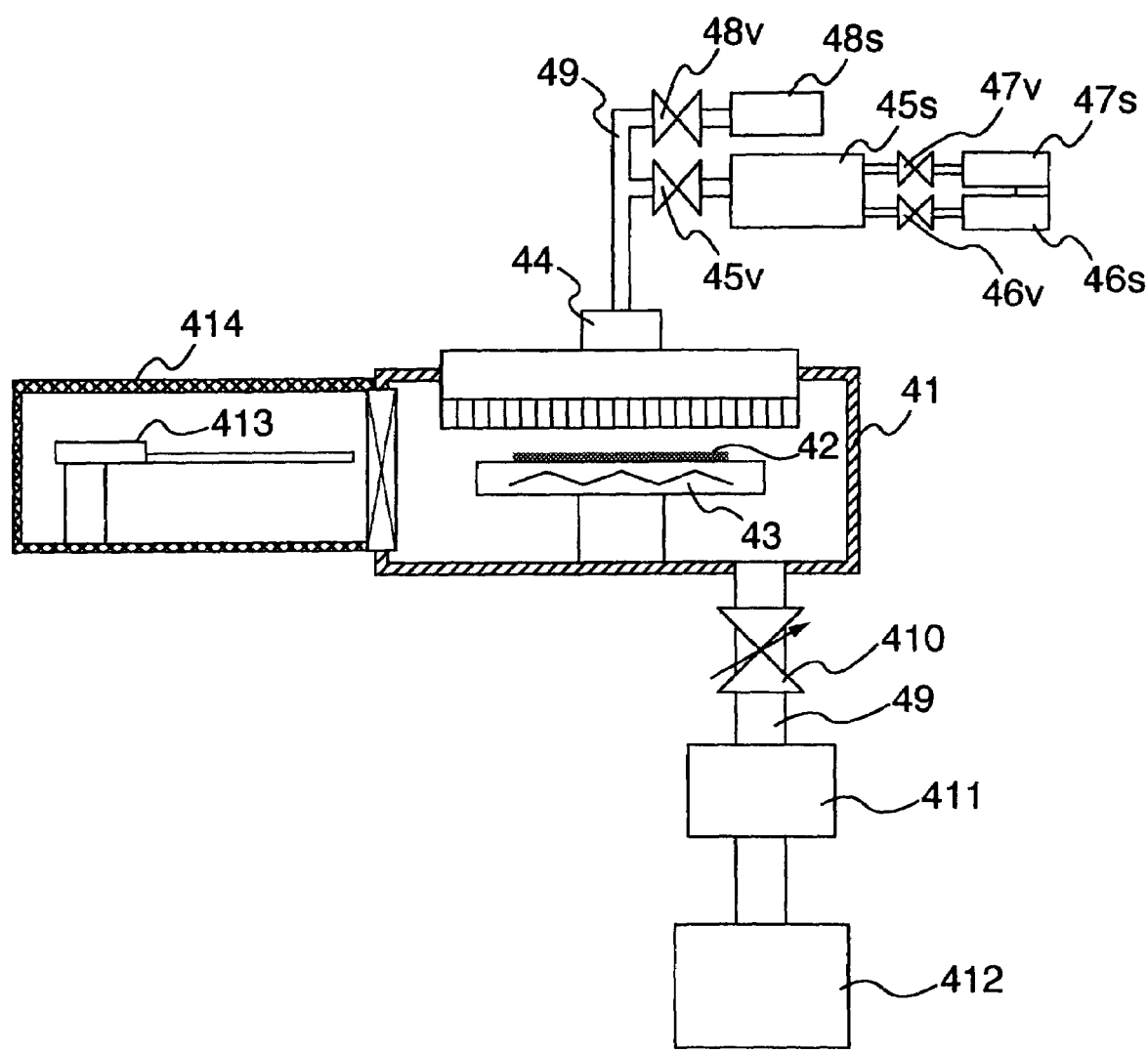
FIG. 4 is a schematic view of an etching reactor used in Example 1.

FIG. 4 is a schematic view showing an etching reactor for removing a portion of the ruthenium film 33.

The etching reactor comprises a treatment chamber 41 for mainly conducting etching treatment, a wafer 42, a suspect heater 43 for heating the wafer 42 and a shower head 44 for supplying a gas. The treatment chamber 41 is provided with a pipe 49 connected to an ozonizer 45s for supplying ozone, an oxygen supplier 46s for forming ozone, a nitrogen supplier 47s and another nitrogen supplier 48s for adjusting an ozone concentration through valves 45v, 46v, 47v and 48v, respectively, and is further provided with a pumping pipe 49 connected to a conductance control valve 410 for adjusting the pressure in the treatment chamber 41, a vacuum pump 411 and a facily 112 for removing ozone, etc., successively. Furthermore, the treatment chamber 41 is connected to a transfer chamber with a transfer arm 413.

At first, etching conditions for the ruthenium film 33 must be determined.

Figure 5:
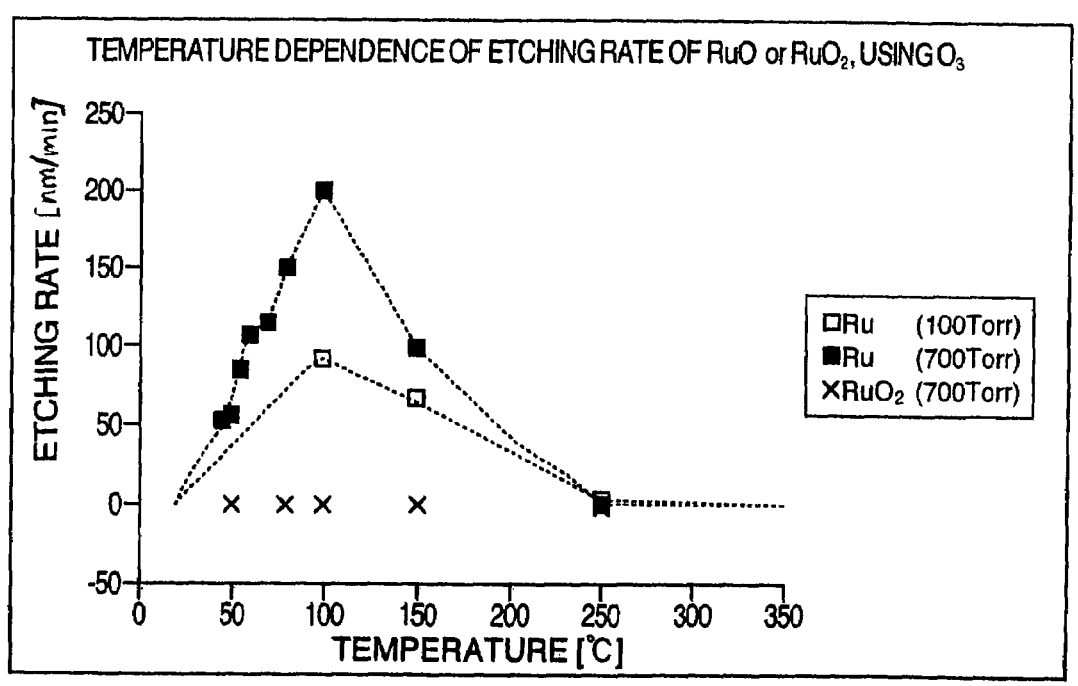
FIG. 5 is a graph showing relationships between ruthenium etching rates and treatment temperatures.

Results of etching characteristics of the ruthenium film 33 by an ozone-containing gas investigated in the reactor shown in FIG. 4 will be explained below:

FIG. 5 is a graph showing the temperature dependency of etching rate when the ruthenium film 33 formed by CVD was etched, for example, by an ozone gas. Etching was carried out at an ozone concentration of 5% and a gas flow rate of 10 slm under pressure each of 100 Torr and 700 Torr in the treatment chamber. Ozone was generated by an ozonizer under silent discharge.

It was found that the ruthenium film was etched by ozone at a treatment temperature ranging from 20° to 350° C. and a maximum etching rate was obtained at about 100° C. The maximum etching rate was several times higher than that of so far known ruthenium film 33. The etching rate was determined by characteristic X-ray intensities measured by X-ray fluorescent analysis.

Figure 6:
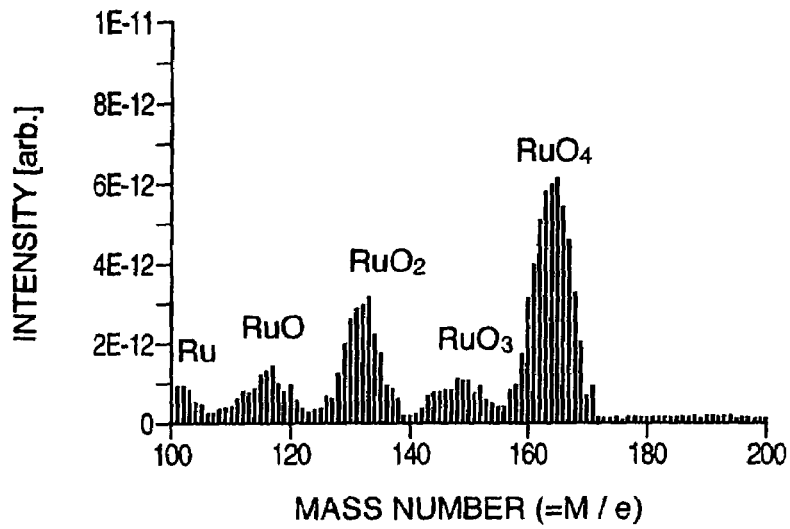
FIG. 6 shows an example of quadruple mass spectrometry (QMS) of reaction products from reactions between ruthenium and ozone.

Etching reaction mechanism between the ruthenium film 33 and the ozone gas will be explained below:

FIG. 6 shows a mass spectrum graph of reaction products from etching treatment of the ruthenium film 33 in the etching reactor as shown in FIG. 4, determined by QMS (quadruple mass spectrometry) in the pipe 49. As is clear from the results, Ru, $RuO_2$, $RuO_3$, and $RuO_4$ were detected as reaction products, among which the reaction product having the highest spectral intensity was found to be $RuO_4$ and the main reaction product from the reaction between the ruthenium film 33 and the ozone gas was also found to be $RuO_4$. It seems that Ru, RuO, $RuO_2$ and $RuO_3$ resulted from decomposition of $RuO_4$ in the ionization chamber of QMS.

In the formation of $RuO_4$ from simple ruthenium metal, it is necessary to decompose the ozone gas as a reactant gas.

Figure 7:
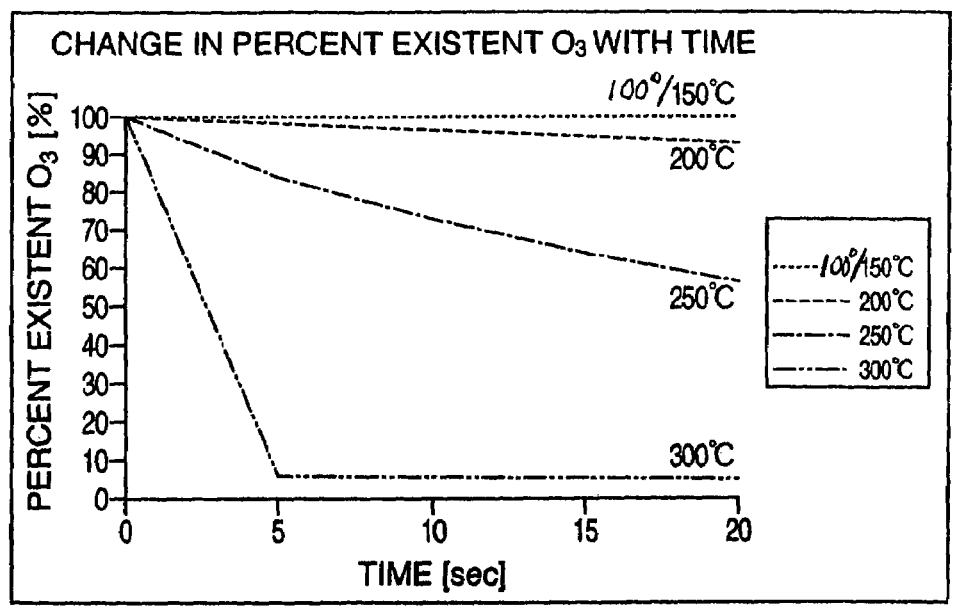
FIG. 7 is a graph showing relationships between thermal decomposition of ozone and existent ratio of ozone on wafers.

FIG. 7 is a graph showing changes in existent rate of ozone (value obtained by subtracting a percent ozone deposition from 100) with time, when the ozone gas supplied into the treatment chamber was thermally decomposed, where FIG. 7 was based on calculation results of data given in Hidetoshi Sugimura:Basics and Application of Ozone, page 58, published by Korin (1996).

In view of the flow rate of the ozone gas in the etching chamber shown in FIG. 4, it would take not more than a few second before the ozone supplied into the treatment chamber 41 was brought into contact with the heated ruthenium, and thus the ozone would be brought into contact with the ruthenium film without any substantial thermal decomposition at a treatment temperature of not more than 200° C.

Thus, it seems that the ozone was decomposed by other energy than heat in the temperature zone showing the maximum etching rate of ruthenium as shown in FIG. 5, contributing to the reaction with ruthenium. The treatment temperature was measured by a well known means, for example, a thermocouple mounted on the surface of the wafer 42 including the ruthenium film 33.

It is reported in the aforementioned "Basics and Application of Ozone" or "Ozone decomposition catalyst with a broadening application field" (JETI, Vol. 39, No. 11, 1991) that the ozone can be decomposed by catalysis of platinum, etc. Ruthenium, on the other hand, belongs to the platinum group and in view of the aforementioned catalysis it seems that the ozone can be decomposed also by catalysis of ruthenium, giving good grounds for $RuO_4$ formation reaction to take place even at low treatment temperatures such as about 100° C.

Figure 8:
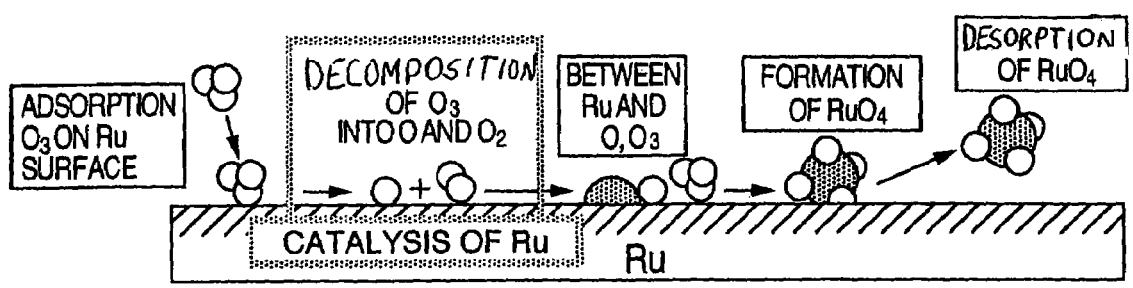
FIG. 8 is a schematic view showing reaction mechanisms between ruthenium and ozone.

It can be seen from the foregoing that reactions between ruthenium and ozone can proceed according to the reaction mechanisms shown in FIG. 8 or reaction equations given in the following Table 1. RuO is very unstable and thus seems to be converted to more stable $RuO_4$ through reactions with ozone.

TABLE 1

$RuO_4$ formation process

| Reaction process | Reaction equation |
| --- | --- |
| ① Supply of $O_3$ onto Ru surface | |
| ② Adsorption of $O_3$ onto Ru surface | $O_3 \rightarrow O_{3ads}$ |
| ③ $O_3$ decomposition | $O_{3ads} \rightarrow O_2 + O_{ads}$ |
| ④ Reaction between Ru and O | $RU + O_{ads} \rightarrow RuO_{ads}$ |
| ⑤ Formation of $RuO_4$ from RuO and $O_3$ | $RUO + O_3 \rightarrow RuO_{4ads}$ |
| ⑥ Desorption of $RuO_4$ | $RuO_{4ads} \rightarrow RuO_4 \uparrow$ |

Note:
"ads" means surface adsorption.

Reasons why the etching rate of ruthenium by ozone starts to lower from the high temperature zone of about 100° C. as shown in FIG. 5 will be explained below:

From results of measurement of a ratio of $RuO_2$ to Ru by weight at the respective treatment temperatures by well known analytical method XPS it was found that the weight of $RuO_2$ existent on the ruthenium film surface was increased with increasing treatment temperature. In FIG. 5, the etching rate obtained by exposing a $RuO_2$ film formed by sputtering merely to an ozone gas is also plotted in FIG. 5 (mark x), from which it is evident that the $RuO_2$ film was substantially not etched by simple ozone.

From the foregoing results it can been seen that at high treatment temperatures the formation reaction of stoichiometrically stable $RuO_2$ is more dominant than the formation reaction of $RuO_4$ shown by reaction equation ⑤ of Table 1 and the $RuO_2$ formed on the surface will inhibit the successive reactions. Reasons why $RuO_2$ is substantially not etched seem to be that $RuO_2$ per se has no catalysis on decomposition of ozone, $RuO_2$ is thermodynamically stable and the difference in Gibbs' free energy of reaction (ΔG) approaches zero or the plus side from the minus side with increasing temperatures as shown in FIGS. 2A to 2C.

In view of the aforementioned reaction mechanisms between ruthenium and ozone, it is important in the removal by etching of a portion of the ruthenium film 33 formed on the substrate 31 shown in FIG. 3B that (1) an etching rate ensuring the necessary throughput for producing a semiconductor device must be obtained, (2) the surface of the ruthenium film 33 must not be modified (oxidized) and (3) uniform etching must be obtained on the surface of the wafer 31.

From the foregoing results of investigation, it has been found that etching treatment of the ruthenium film 33 can be carried out with ozone at a treatment temperature ranging from 20° to 350° C. However, to obtain an etching rate ensuring a production throughput and suppress oxidation on the surface of the ruthenium film 33, the treatment temperature is preferably restricted to a range of 40°-200° C. To conduct uniform etching of the surface of the wafer 31, an ozone gas must be uniformly supplied onto the surface in the treatment chamber 41 when the reaction is in a diffusion rate-determining step or the treatment temperature must be made uniform over the surface of the wafer 31 when the reaction is in a reaction rate-determining or desorption rate-determining step.

Figure 9:
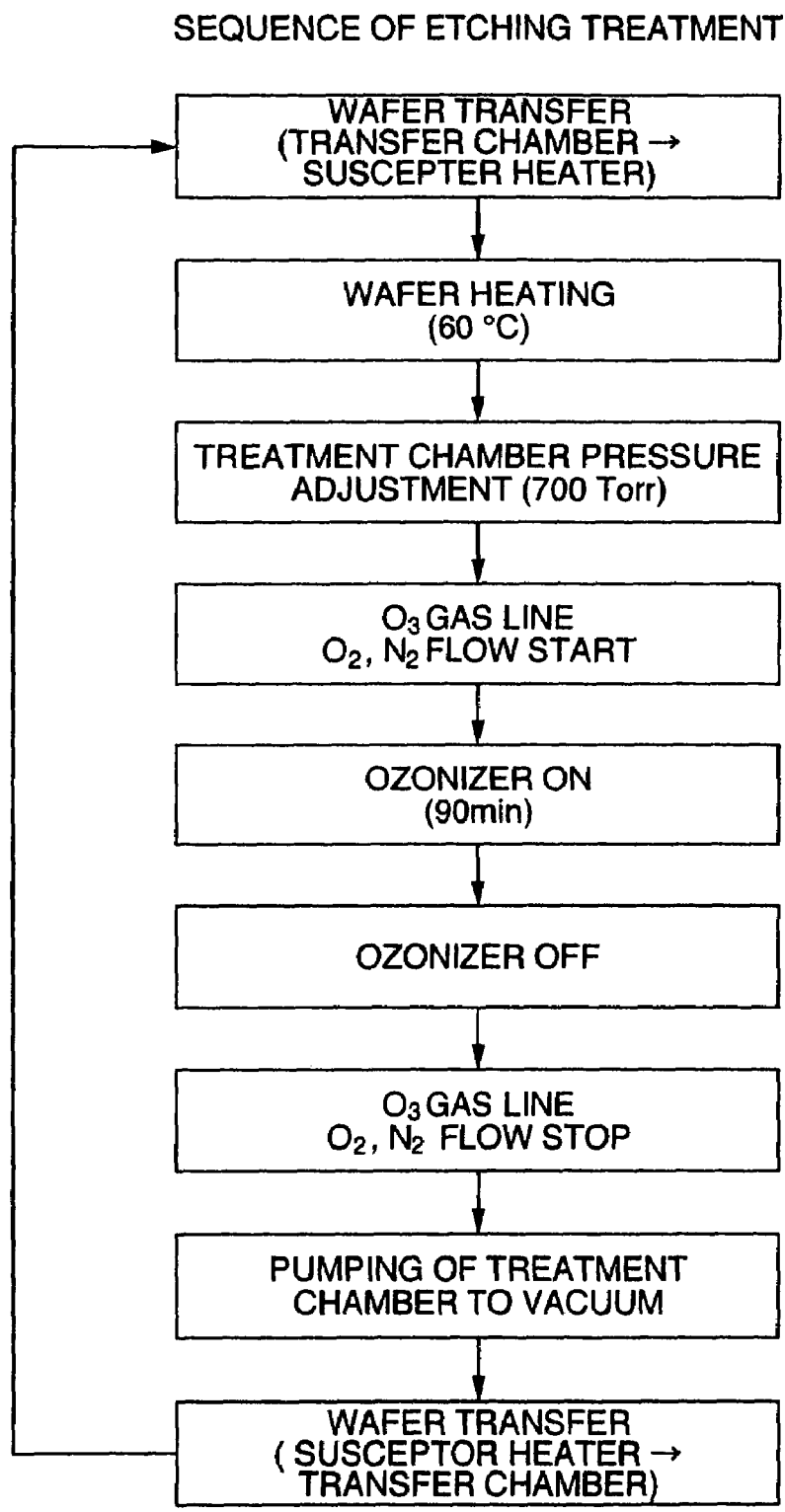
FIG. 9 is a block diagram showing a sequence of etching treatment steps according to Example 1.

Etching was conducted at the treatment temperature of 60° C., which is in a desorption rate-determining step, in the reactor shown in FIG. 4, whose a treatment sequence is shown in FIG. 9.

According to the treatment sequence of FIG. 9, a portion of the ruthenium film 33 formed on the substrate wafer 31 was carried out at the treatment temperature of 60° C. As a result, ruthenium film plugs 33 were formed, as shown in FIG. 32. The uniformness on the surface of the wafer 31 obtained in that etching rate was found to be about ±5%, which was on a practically trouble-free level.

In this embodiment, etching of the ruthenium film 33 could be carried out at a relatively high rate by using on ozone gas, and no plasma is used in the reactions, giving no damages to the substrate 31. Damages to members of etching reactor, for example, corrosion, etc. of metallic parts, could be suppressed by using an ozone gas.

In the foregoing embodiment, ozone was used as an etching gas, but use of oxygen halide, nitrogen oxide and atomic oxygen had the same effect as above. The same effect was also obtained by introducing an oxygen or nitrogen oxide gas excited by ultraviolet rays or plasma beforehand.

In the foregoing embodiment, a gas mixture of oxygen and nitrogen further containing a few % of ozone was used, but even further addition of a halogen gas and a hydrogen halide such as fluorine, chlorine, bromine, chlorine fluoride, hydrogen fluoride, hydrogen chloride, hydrogen bromide, etc. thereto had the same effect.

In this embodiment, addition of a reductive gas such as hydrogen, carbon monoxide, ammonia, phosphorus hydride, etc. in place of a few % of ozone to the gas mixture of oxygen and nitrogen also had the same effect.

The foregoing results were also true of a ruthenium oxide film, an osmium film and an osmium oxide film, where the same effect as in case of the ruthenium film could be obtained.

EXAMPLE 2

Ruthenium film or its particles deposited on the wafer backside or edges of the wafer upside was removed.

For example, in a CVD reactor for a ruthenium film, a wafer is placed on a heater and heated, where the heater temperature is at a film-forming temperature or higher, and consequently the ruthenium film is formed not only on the wafer, but also sometimes on the heater besides the wafer. Repetition of the CVD film formation sometimes causes deposition of a ruthenium film on the wafer back-side. To prevent formation of a ruthenium film on the edges of the wafer upside, the edges are sometimes brought into contact with a shadow ring for preventing supplying of a film-forming gas to the edges, but a ruthenium film is formed even on the shadow ring due to as high a shadow ring temperature as the heater temperature.

When the wafer with the ruthenium film deposited on the wafer backside or wafer upside edges is subjected to another treatment in a successive reactor, the ruthenium film deposited on the wafer backside or wafer upside edges per se causes contamination of the successive reactor, giving an adverse effect on the performance of ultimate semiconductor devices.

Thus, a cleaning process for removing the ruthenium film or particles deposited on the wafer backside or wafer upside edges after the CVD film formation or etching is indispensable for preventing any ruthenium film contamination from other reactors.

Figure 10A:
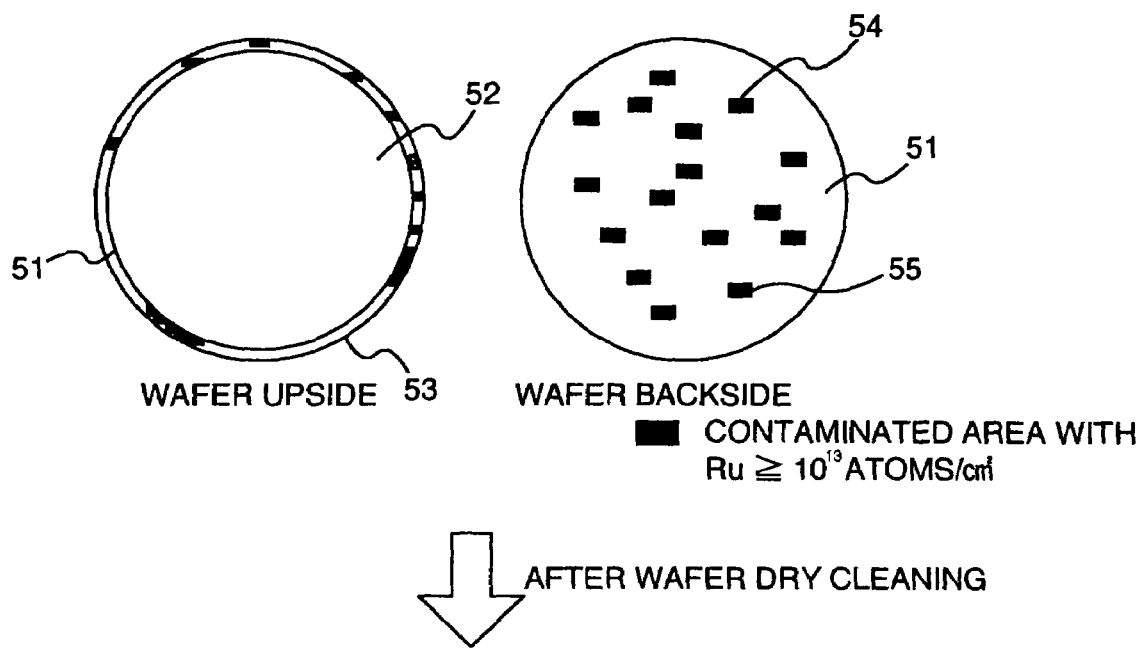
FIGS. 10A and 10B are schematic views showing an ozone cleaning effect on ruthenium-contaminated wafers according to Example 2.

In FIG. 10A, a device pattern 52 is formed on the upside of a wafer 51, where upside edges 53 and the backside of the wafer 51 are contaminated with a ruthenium film 54 or ruthenium particles 55. Areas with a ruthenium contamination rate (intensity detected by fluorescent X-ray) of not less than $10^{13}$ atoms/cm$^2$ on the upside edges 53 and the backside of the wafer 51, measured by well known total reflection fluorescent X-ray are indicated by black areas.

Figure 10B:
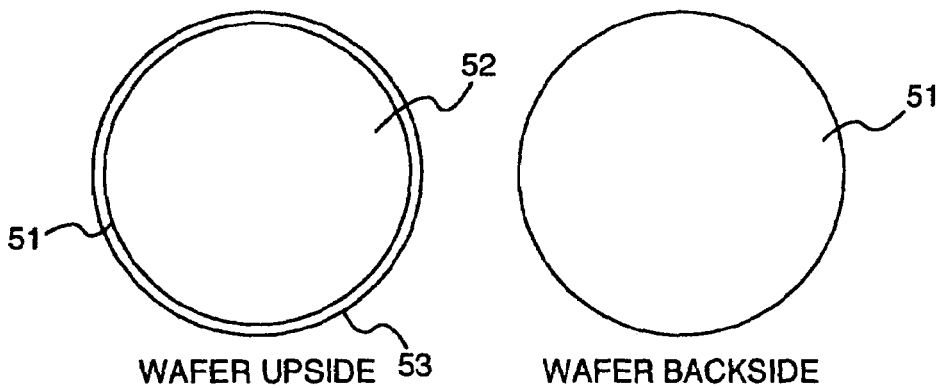

FIG. 10B shows cleaning effect of ozone on the wafer 51, where other surfaces of the wafer 51 than the backside and upside edges 53 of the wafer 51 are coated with a resist before exposing the wafer 31 to ozone, so that the ruthenium film formed on the pattern 52 of the device may not be etched. The surface layer each on the backside and upside edges 53 of the wafer 51 is made from a silicon oxide film.

Ozone etching selectivity between ruthenium and ozone was investigated by changing the treatment temperature from room temperature to 300° C. As a result, it was found that the etching rate of ruthenium was higher than that of the resist at temperatures of not more than about 180° C., whereas the etching rate of the resist was higher above 180° C. As already shown in Example 1, it seems that the ozone is decomposed by catalysis of ruthenium, promoting the etching at low temperatures, whereas the resist itself has no catalysis. This is a significant difference as mentioned above.

Thus, the device pattern 52 can be protected from etching by covering the device pattern-formed area 52 with a resist and conducting etching at a temperature of not more than 180° C. To effectively remove ruthenium contaminants in view of treatment throughput, the treatment temperature is desirably not less than about 40° C.

FIG. 10B shows results of cleaning the wafer 51 shown in FIG. 10A under the aforementioned conditions. As is obvious therefrom, the ruthenium-contaminated areas 55 have been removed from the upside edges 53 and the backside of the wafer 51.

Figure 11:
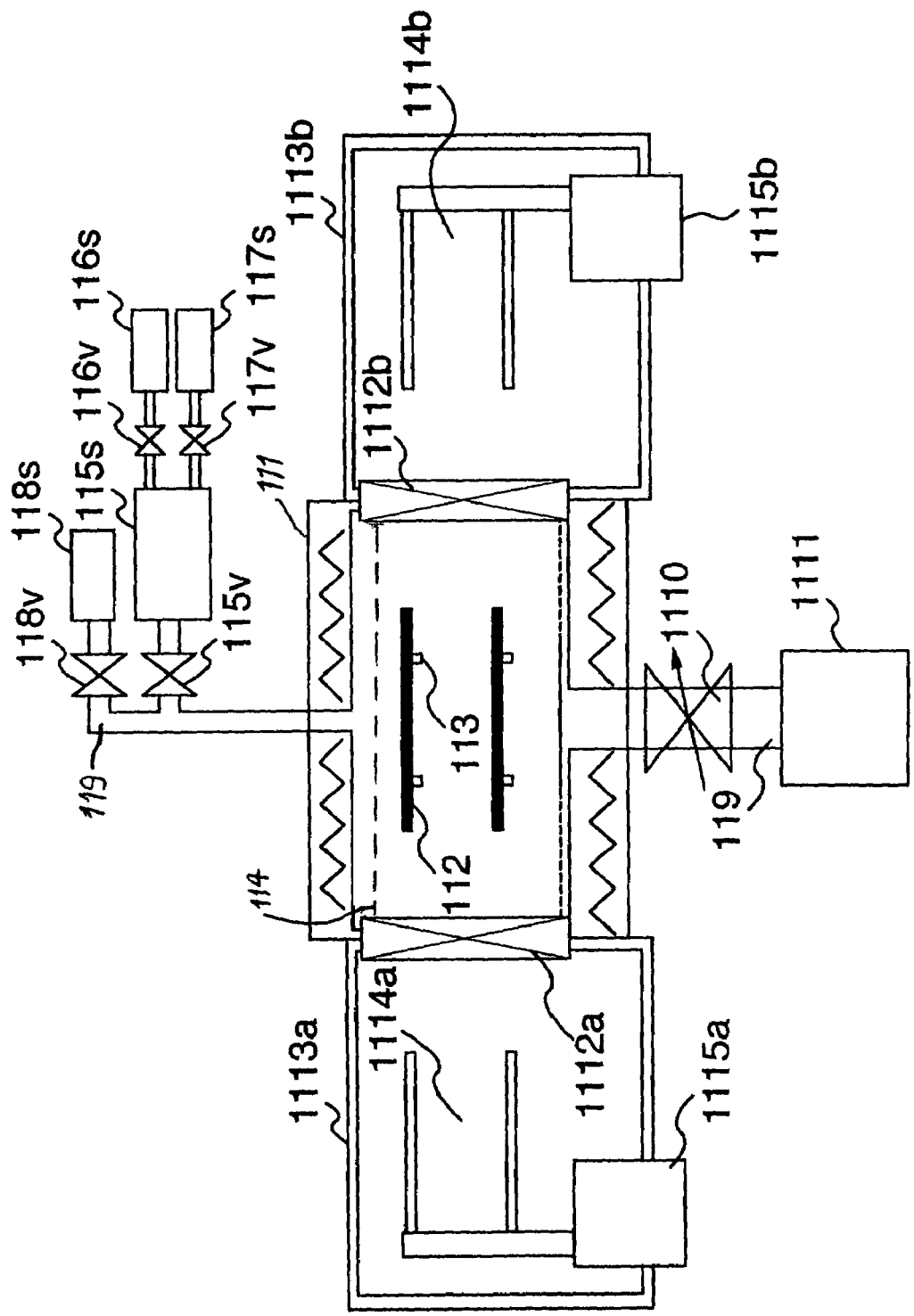
FIG. 11 is a schematic view showing an ozone cleaning reactor according to Example 2.

FIG. 11 is a schematic view of a ruthenium dry cleaning reactor into which the aforementioned results of investigation are incorporated. This example presupposes a hot wall type cleaning reactor of batch system, which comprises a treatment chamber 111 with a heating means, directed mainly to a cleaning treatment, wafers 112, quartz wafer supports 113 for supporting wafers and gas diffusers 114. The treatment chamber 111 is provided with a pipe 119 connected to an ozonizer 115s for supplying ozone, an oxygen supplier 116s necessary for forming ozone, a nitrogen supplier 117s, and another nitrogen supplier 118s for adjusting the ozone concentration through respective valves 115v, 116v, 117v and 118v, and also provided with a pumping pipe 119 connected to a conductance control valve 1110 for adjusting the pressure in the treatment chamber 111 and a vacuum pump 111. Furthermore, the treatment chamber 111 is provided at both sides with transfer chambers 1113a and b with arms 1114a and b for transporting the wafers 112, operated by transfer robots 1115a and b, through gate valves 1112a and b, respectively.

The cleaning reactor may be connected to an etching reactor or a CVD reactor through the transfer chamber 1113.

Cleaning treatment was carried out in the following manner:

The wafer 112 with the device pattern formed thereon and coated with a resist (whose ruthenium contamination rate being substantially the same as that of FIG. 10A) was transferred into the treatment chamber 111 and treated at 100° C. The temperature was selected in view of a higher etching rate of ruthenium, a higher selectivity ratio of ruthenium to resist (about 100) and also assurances of protecting even the resist against modification. The wafer 112 was mounted on the supports 113 in a face-down mode of turning the resist-formed side downward so as to prevent contact of the wafer backside and the upside edges with reactor members as much as possible.

Pressure was 700 Torr with a flow rate of 10 slm, an ozone concentration of 10% and a cleaning time of 3 minutes.

The treated wafer 112 was transferred from the treatment chamber 111 and subjected to measurement ruthenium contamination rates of the treated wafer by total reflection fluorescent X-ray. The results showed the same as in FIG. 10B. That is, the existent ruthenium contamination rate on the upside edges and the backside of the treated wafer 112 was below the detection limit of the detector. Furthermore, the existent rate on the wafer backside was found to be not more than $5 \times 10^{10}$ atoms/cm$^2$ by measurement using a well known ICP-Mass spectrometer. From these results it can be seen that ruthenium contaminants deposited on the unwanted parts of the wafer 112 could be removed by the aforementioned cleaning treatment.

In this embodiment, neither rinsing step nor drying step as in the wet process is required due to the dry process, and effective cleaning can be carried out by chemical reactions with an ozone gas, using no plasma, without giving any damages such as corrosion, etc. to substrates per se or cleaning reactor members such as metallic parts.

In the foregoing embodiment, the cleaning treatment was carried out at 100° C., but a cleaning treatment temperature ranges preferably of 20° to 350° C., which enables ruthenium etching with ozone, more preferably a temperature range of 40° to 200° C., which ensures a satisfactory selectivity ratio of ruthenium to a resist, and most preferably a temperature range of 40° to 180° C.

In the foregoing embodiment, cleaning to remove ruthenium contaminants was illustrated, but it is needless to say that an etching treatment of a ruthenium film on a semiconductor device with a resist formed thereon as a mask for forming a pattern can be likewise carried out with a high throughput.

In the foregoing embodiment, ozone was used as a cleaning gas, but similar effects can be obtained with oxygen halide, nitrogen oxide and atomic oxygen, or also by supplying into the treatment chamber oxygen or nitrogen oxide excited by ultraviolet ray or plasma beforehand. In the foregoing embodiment, a gas mixture of oxygen and nitrogen containing a few % of ozone was used, but similar effects can be obtained when a halogen gas or a hydrogen halide gas such as fluorine, chlorine, bromine, chlorine fluoride, hydrogen fluoride, hydrogen chloride, hydrogen bromide, etc. or a reductive gas such as hydrogen, carbon monoxide, ammonia, phosphorus hydride, etc. is added thereto.

The forementioned cleaning effect can be obtained not only in case of the ruthenium film, but also in case of a ruthenium oxide film, an osmium film and an osmium oxide film.

EXAMPLE 3

Figure 12:
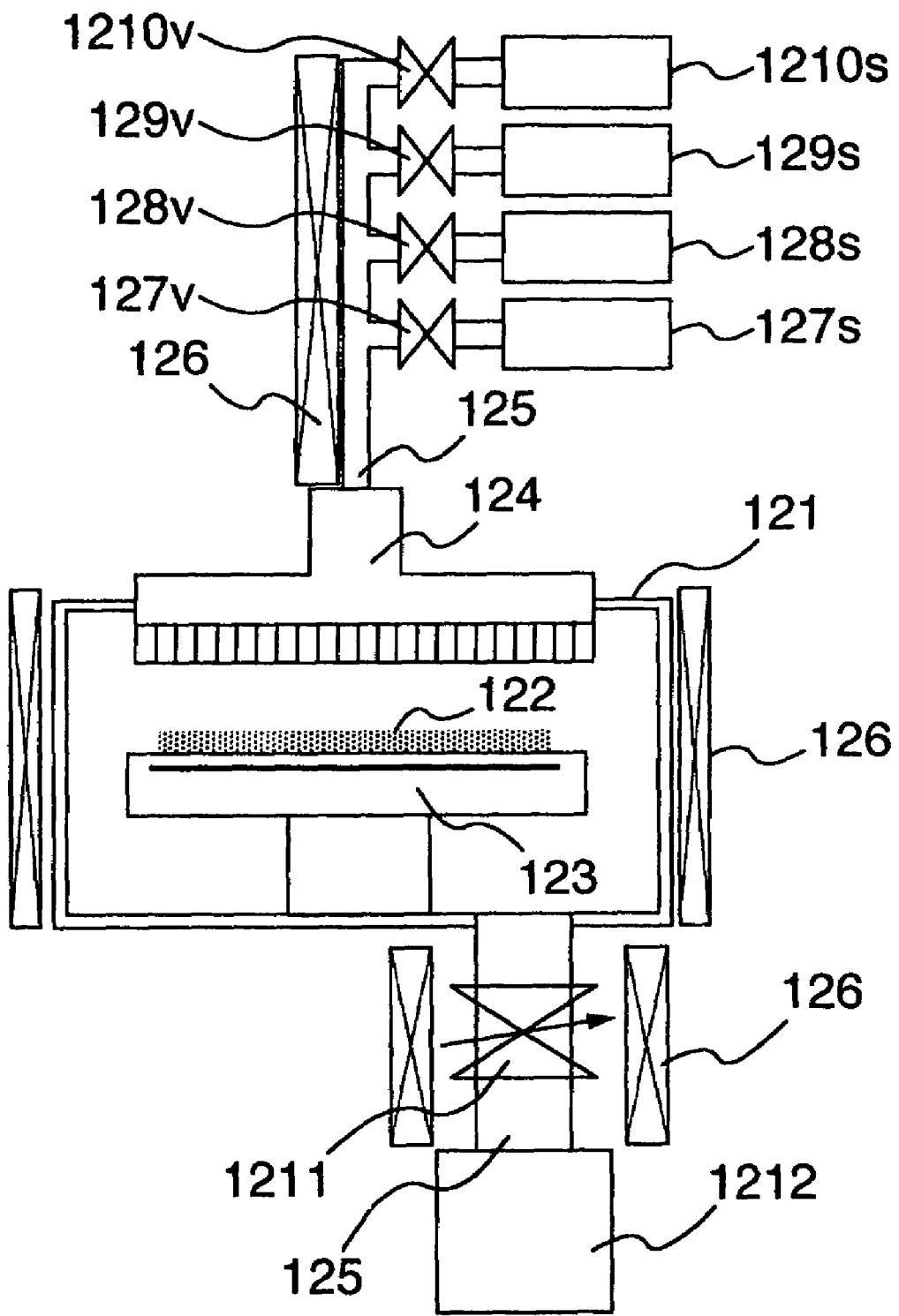
FIG. 12 is a schematic view showing cleaning of a CVD reactor according to Example 3.

An embodiment of applying the present invention to cleaning of a ruthenium CVD reactor is given below:

FIG. 12 shows a ruthenium or ruthenium oxide CVD reactor.

The CVD reactor for conducting film-forming reactions comprises a chamber 121, a wafer 122, a ceramic heater 123 for heating the wafer 122 and a gas shower head 124 for uniformly supplying a film-forming gas onto the wafer 122. Pipes 125 for supplying or pumping the film-forming gas or a cleaning gas and the chamber 121 are heated by heaters 126 for preventing deposition of reaction products.

The chamber 121 is provided with the gas supply pipe 125 connected to an Ru (EtCp)$_2$ supplier 127s for supplying Ru (EtCp)$_2$ upon gasification as a film-forming gas [where EtCp is an abbreviation of ethylcyclopentadienyl (C$_2$H$_5$C$_5$H$_4$)], an O$_2$ supplier 128s, an N$_2$ supplier 129s and an O$_3$ supplier 1210 as a cleaning gas supplier through valves 127v, 128v, 129v and 1210v, respectively.

The chamber 121 is also provided with the pumping pipe 125 connected to a conductance control valve 1211 for adjusting the pressure in the chamber 121 and a vacuum pump 1212.

The reactor is a cold wall type reactor, where the wafer 122 is heated to about 300° to about 750° C. by the wafer 122-mounted heater 123. When the film-forming gas is used, the heater 123 is set to e.g. 320° C. to obtain a film forming temperature of 300° C., whereas the chamber 121, and the pipes 125 are heated at about 150° C. by heaters 126 so that the film-forming gas may not condense on the inside walls of the reactor 121 and pipes 125.

However, a large amount of unwanted Ru-containing reaction products inevitably deposit on the inside wall of the chamber 121, etc. by decomposition reaction of the film-forming gas. To obtain uniform temperature distribution over the wafer, practically the heater size is made larger than the wafer size, while increasing the heat input to the wafer peripheral parts of large heat escaping tendency. As a result, ruthenium or ruthenium oxide inevitably deposits on the peripheral part of the heater 123.

With repetitions of the foregoing CVD step, the deposits on the inside walls of the chamber 121 and the pipes 125 are peeled off, and the resulting peelings whirp up by the flowing gas stream, etc. and fall onto the wafer 122 during the film forming. As a result, the peelings fallen as particles on the wafer cause failures such as short circuits, disconnection, etc. of formed device patterns.

Effects of cleaning with ozone on particle abatement were investigated in the following manners:

(1) Ruthenium Film Formation

At first, the inside of the chamber 121 was evacuated to a desire degree of vacuumness and the wafer 122 was mounted on the heater 123 and the heater 123 was set to 320° C. to maintain the temperature of the wafer 122 in a thermal equilibrium state, where the wall of the chamber 121 and the pipes 125 were at about 150° C. Then, the valves 127v and 128v were opened to supply the Ru (EtCp)$_2$ gas and the O$_2$ gas into the chamber 121, respectively, conducting formation of a 0.1 μm-thick ruthenium film. The pressure in the chamber 121 was adjusted to a desired pressure by the conductance control valve 1211.

(2) Cleaning With Ozone

Particle count on the film-formed wafer 122 tended to increase when the accumulated film thickness exceeds about 3 μm in the film forming step when repeated in the same chamber. Thus, cleaning of the chamber 121 was conducted at every 30 runs of the film formation step.

Time allowed for the cleaning was calculated from the throughput and the rate of operation of the CVD reactor and was found to be within about one hour. Thus, chamber cleaning with ozone was carried out, for example, by lowing the temperature of the heater 123 to a temperature ensuring a satisfactory etching rate, for example, 150° C., while keeping the temperatures of the chamber 121 and the pipes 125 with large heat capacities as they were.

The valve 1210v was opened to supply an ozone gas from the ozone supplier 1210s and the pumping rate was adjusted by the conductance control valve 1211 in the same manner as in case of the film formation. The gas flow rate was 10 slm under pressure of 100 Torr.

Figure 13:
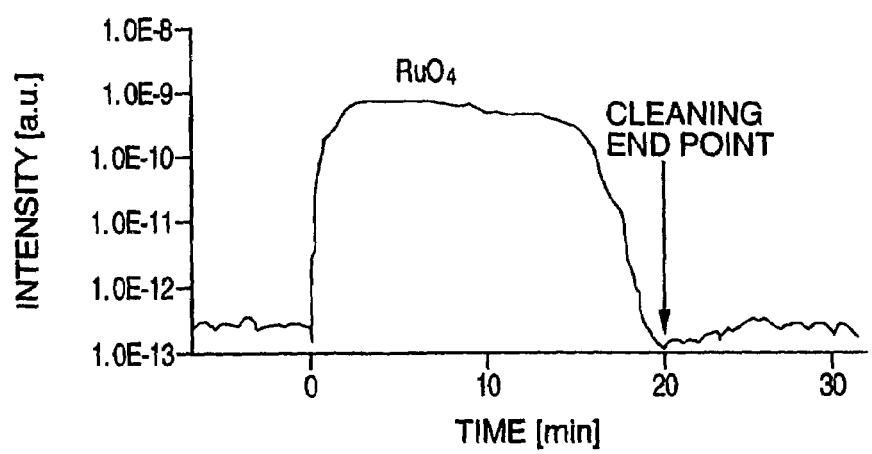
FIG. 13 is a graph showing results of QMS reaction analysis relating to detection of a cleaning end point.

Detection of cleaning end point was made by providing a QMS sampling point at the pumping pipe 125 and measuring changes in the ion intensity of reaction product gas generated during the cleaning from time to time, as shown in FIG. 13. Specifically, the time when the change in the intensity became very small due to increasing ion intensity of RuO$_4$ was deemed to be a cleaning end point. In this embodiment, ozone supply was interrupted about 20 minutes after the start of cleaning. In this embodiment, a series of treatments were conducted within about one hour including the time required for temperature adjustment of the heater 123, pressure adjustment in the chamber 121, cleaning, etc.

The cleaning time could be about 20—about 30% shortened by using a 5% ClF$_3$ or 5% CO-containing ozone gas, as already mentioned above.

Presupposing a case of repeating a series of such operations as ruthenium film formation and cleaning with ozone, changes in particle count on wafers 122 during the operations were measured.

Figure 14:
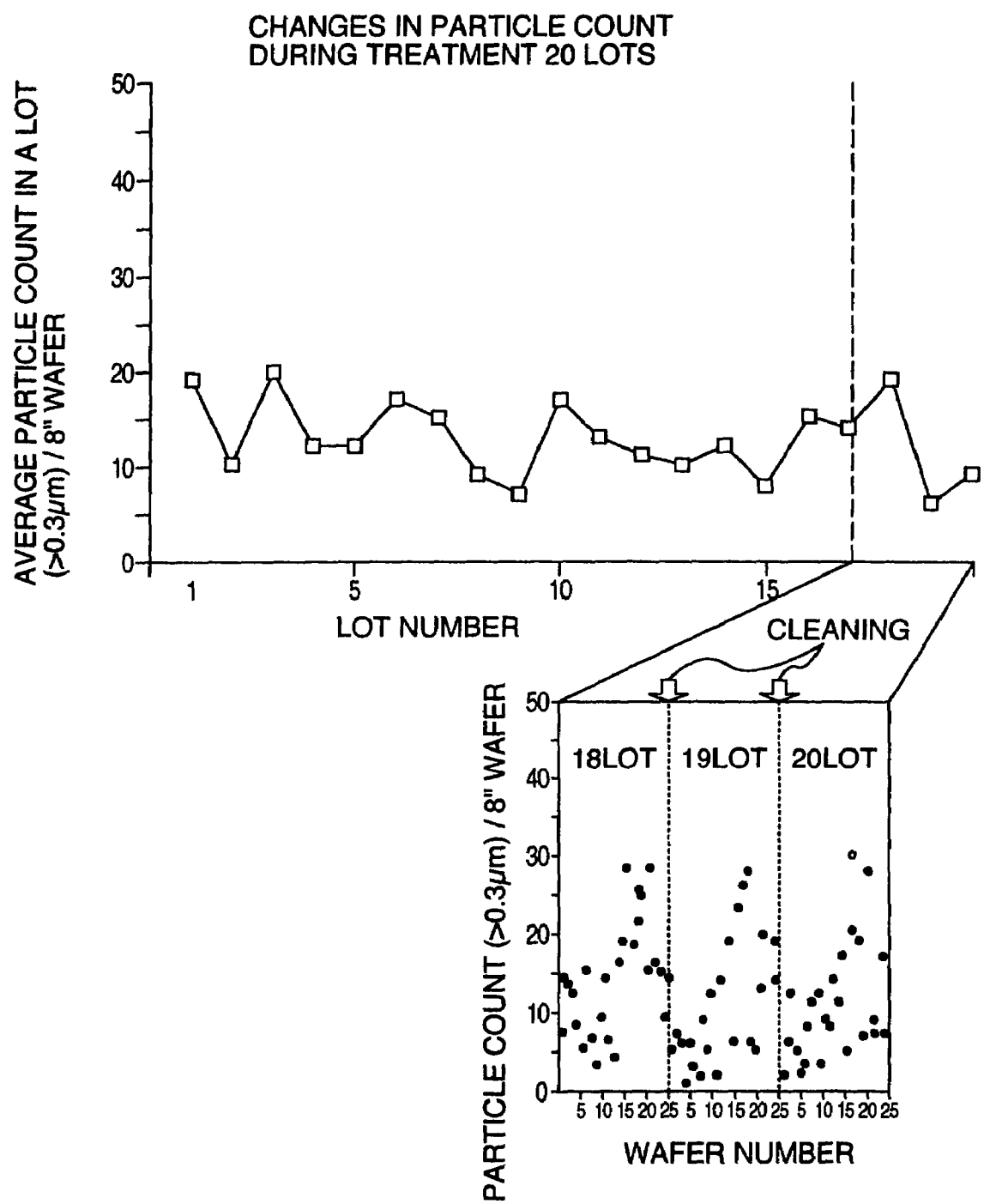
FIG. 14 is a graph showing changes in particle counts in CVD reactor by cleaning.

FIG. 14 shows changes in particle count (particle sizes>0.3 μm), which is an average in 20-30 repetitions of film formation on 8-inch wafers. As is obvious from the results of FIG. 14, particle count on the wafers could be reduced substantially to the initial state by chamber cleaning, and even if the count number is increased by successively conducting the film formation step, the increased count number could be again reduced by recleaning.

As explained above, generation of particles in the chamber could be suppressed for a long time by conducting ozone cleaning at the specific stages in the film formation step, whereby the ruthenium film formation could be conducted in a stable rate.

Visual observation of the reactor inside after 20 runs of cleaning with the ozone gas revealed that there were no metal corrosion, etc. of the chamber members.

In the foregoing embodiment, the cleaning was carried out at about 150° C., but can be carried out at a temperature of 20° to 350° C., which enables ruthenium etching with ozone, preferably at a temperature of 40° to 200° C., which ensures a relative high ruthenium etching rate, and more preferably at a temperature of 40° to 180° C.

According to the present invention, particles within the chamber can be reduced by cleaning with an ozone gas, thereby improving the production yield of semiconductor devices, as mentioned above.

Furthermore, etching can be carried out without plasma and thus inside members of the chamber, that is, so called cleaning gas-supplied parts, can be etched, and thus deposit residues within the chamber can be much reduced, as compared with the conventional plasma cleaning.

Other oxygen halide, nitrogen oxide, atomic oxygen, etc. than ozone, or oxygen or nitrogen oxide excited by ultra-violet ray or plasma beforehand than ozone can be supplied into the chamber as an etching gas with the similar effect. A gas mixture of oxygen and nitrogen containing a few % of ozone further admixed with a halogen gas or a hydrogen halide gas such as fluorine, chlorine, bromine, chlorine fluoride, hydrogen fluoride hydrogen chloride, hydrogen bromide, etc. or with a reductive gas such as hydrogen, carbon monoxide, ammonia, phosphorus halide, etc. has the similar effect.

The foregoing is applied not only to the ruthenium film, but also to a ruthenium oxide film, an osmium film and an osmium oxide film.

EXAMPLE 4

An embodiment of applying the present invention to cleaning of a ruthenium etching reactor is given below:

When the etching treatment is repeated in the etching reactor, reaction products are formed by reactions between the target film to be etched or the resist film and the etching gas and deposited on the chamber inside. The deposited reaction products act as particles as in case of the CVD reactor, lowering the device production yield.

Effect of cleaning with ozone on particle abatement in the etching reactor was thus investigated.

(1) Etching of Ruthenium Film (Pattern Formation)

At first, a wafer 12 with a resist patterned on a ruthenium film was placed on an electrode in a chamber evacuated to a desired degree of vacuumness, and the electrode temperature was adjusted to 20° C. Then, etching was carried out by supplying an O$_2$ gas, a Cl$_2$ gas and a N$_2$ gas to the chamber, while adjusting the pressure in the chamber. After the etching, the wafer 12 was transferred from the chamber, and the chamber was evacuated again.

In this Example, cleaning with ozone was conducted at every 50 runs of the wafer etching treatment in the following manner:

(2) Cleaning With Ozone

As in case of the CVD reactor, the temperature of the electrode on which the wafer was placed was set to about 100° C. during the cleaning and the cleaning was carried out for 15 minutes. A series of the etching steps and the cleaning step was repeated 20 times to measure changes in particle count.

As a result, it was found that the particle count could be maintained on a low level in the chamber by cleaning with an ozone gas and there were no corrosion, etc. on the surfaces of metallic parts in the chamber (visual observation).

Temperature conditions for cleaning treatment, and cleaning gas component, etc. are not restricted to those as mentioned in the foregoing embodiment, and the cleaning rate can be improved, for example, by adding a halogen-based gas or a reductive gas to the cleaning gas as in case of the aforementioned CVD reactor.

As explained above, chamber cleaning can be conducted for a short time by maintaining appropriate cleaning conditions, thereby contributing not only to improvement of stable operation for a long time and the rate of operation of the reactor, but also to improvement of production yield of devices.

While we have shown and described several embodiments in accordance with our invention, it should be understand that the disclosed embodiments are susceptible of changes and modifications without departing from the scope of the invention. Therefore, we do not intend to be bound by the details shown and described herein but intend to cover all such changes and modifications as falling within the ambit of the appended claims.

What is claimed is:

1. A process for cleaning a reactor for producing a semiconductor device, the reactor comprising a treatment chamber for treating a substrate, which comprises removing at least one of ruthenium, osmium and a reaction product comprising at least one of ruthenium and osmium accumulated or deposited on the surfaces of members in the treatment chamber by supplying a gas comprising an atomic oxygen-donating gas, and forming a tetraoxide of at least one of ruthenium and osmium, having a high vapor pressure, using an oxidation reaction with the at least one of the ruthenium, osmium and the reaction product at a temperature of 350° C. or lower, thereby cleaning the reactor by non-plasma etching.

2. A process according to claim 1, wherein the reactor for producing a semiconductor device is a CVD reactor for forming a film comprising at least one member selected from the group consisting of ruthenium, ruthenium oxide, osmium and osmium oxide above the substrate, an etching reactor for forming a pattern above the substrate by treating the film by etching, or a cleaning reactor for removing any one of ruthenium, osmium and the reaction product containing at least one of ruthenium and osmium, deposited above the substrate.

3. A process according to claim 1, wherein the surfaces of members is at least one of a susceptor surface, an inlet surface for the gas, an outlet surface for the gas, an inside wall of the treatment chamber and an inside wall of pipes.

4. A process according to claim 1, wherein the atomic oxygen-donating gas comprises at least one member selected from the group consisting of ozone, oxygen halide, nitrogen oxide and atomic oxygen.

5. A process according to claim 1, wherein the atomic oxygen-donating gas contains a halogen gas, a hydrogen halide gas or a reductive gas and is subjected to the cleaning of the surfaces of members.

6. A process according to claim 1, wherein the atomic oxygen-donating gas contains at least one member selected from the group consisting of fluorine, chlorine, bromine, chlorine fluoride, hydrogen fluoride, hydrogen chloride, hydrogen bromide, hydrogen, carbon monoxide, ammonia and phosphorus hydride and is subjected to the cleaning of the surfaces of members.

7. A process according to claim 1, wherein the surfaces of members are cleaned so as not to form an ion sheath on or above the surfaces of members.

8. A process according to claim 1, wherein when a gas comprising an atomic oxygen-donating gas is supplied onto the surfaces of members, the surfaces of members are at a temperature of 40° to 200° C.

9. A process according to claim 1, wherein when a gas comprising an atomic oxygen-donating gas is supplied onto the surface of members, the surfaces of members are at a temperature of 40° to 180° C.

10. A process for cleaning a reactor for producing a semiconductor device, the reactor comprising a treatment chamber for treating a substrate, which comprises (1) a step of transferring a substrate into the treatment chamber, (2) a step of treating the substrate, (3) a step of transferring the treated substrate from the treatment chamber, and (4) a step of cleaning to remove products accumulated or deposited on the surfaces of members in the treatment chamber after the transfer of the substrate, where the product is at least one of ruthenium, osmium and a reaction product comprising at least one of ruthenium and osmium, the product is removed by supplying a gas comprising an atomic oxygen-donating gas, and forming a tetraoxide of at least one of ruthenium and osmium, having a high vapor pressure, using an oxidation reaction with the product at a temperature of 350° C. or lower, thereby cleaning the reactor by non-plasma etching, and the step (4) is carried out after desired repetitions of the step (2).

11. A process according to claim 10, wherein the reactor for producing a semiconductor device is a CVD reactor for forming a film comprising at least one member selected from the group consisting of ruthenium, ruthenium oxide, osmium and osmium oxide above the substrate, an etching reactor for forming a pattern above the substrate by treating the film by etching, or a cleaning reactor for removing any one of ruthenium, osmium and the reaction product containing at least one of ruthenium and osmium, deposited above the substrate.

* * * * *